United States Patent
Gunawan

(10) Patent No.: US 10,082,408 B2
(45) Date of Patent: Sep. 25, 2018

(54) VOLTAGE-TUNABLE 1D ELECTRO-MAGNET POTENTIAL AND PROBE SYSTEM WITH PARALLEL DIPOLE LINE TRAP

(71) Applicant: International Business Machines Corporation, Armonk, NY (US)

(72) Inventor: Oki Gunawan, Westwood, NJ (US)

(73) Assignee: International Business Machines Corporation, Armonk, NY (US)

(*) Notice: Subject to any disclaimer, the term of this patent is extended or adjusted under 35 U.S.C. 154(b) by 339 days.

(21) Appl. No.: 15/131,443

(22) Filed: Apr. 18, 2016

(65) Prior Publication Data
US 2017/0299410 A1 Oct. 19, 2017

(51) Int. Cl.
*G01R 33/00* (2006.01)
*G01D 5/24* (2006.01)

(52) U.S. Cl.
CPC ..................... *G01D 5/24* (2013.01)

(58) Field of Classification Search
CPC . Y10S 977/762; F16C 39/063; C01B 31/0206
USPC ....... 324/331, 345, 381, 463, 214, 206, 202, 324/207.11–207.26, 219, 228, 246, 260, 324/262, 529, 750.12, 750.21, 750.22, 324/754.17, 754.29, 173, 179; 438/3, 438/666, 674; 257/108, 295, 421, 422, 257/E21.024, E21.013
See application file for complete search history.

(56) References Cited

U.S. PATENT DOCUMENTS 3,225,608 A * 12/1965 Simon ................. F16C 32/0436
244/1 R
4,658,658 A * 4/1987 Fremerey ................. G01P 3/52
324/167
4,695,796 A * 9/1987 Omet ..................... G01D 5/344
250/577
(Continued)

FOREIGN PATENT DOCUMENTS

JP H05219766 A 8/1993

OTHER PUBLICATIONS

Gunawan et al., "A parallel dipole line system," Applied Physics Letters 106, pp. 062407-1-5 (Feb. 2015).
(Continued)

*Primary Examiner* — Jermele M Hollington
*Assistant Examiner* — Taqi Nasir
(74) *Attorney, Agent, or Firm* — Vazken Alexanian; Michael J. Chang, LLC

(57) ABSTRACT

Techniques for manipulating objects and for determining the position of the objects in parallel dipole line (PDL) trap systems are provided. In one aspect, a PDL trap is provided. The PDL trap includes: a pair of dipole line magnets connected to a potential, wherein the pair of dipole line magnets includes magnets having magnetizations perpendicular to long axes of the magnets; a diamagnetic rod levitating above the pair of dipole line magnets; and at least one electrode above the pair of dipole line magnets, adjacent to the diamagnetic rod. The system produces a hybrid one-dimensional electromagnetic potential which is tunable by voltage. Techniques for operating the PDL trap to manipulate the diamagnetic rod and to detect a position of the diamagnetic rod in the PDL trap are also provided.

20 Claims, 11 Drawing Sheets

(56) References Cited

U.S. PATENT DOCUMENTS

| | | | |
|---|---|---|---|
| 5,117,183 A * | 5/1992 | Santos | F02P 7/0677 |
| | | | 324/228 |
| 6,621,395 B1 | 9/2003 | Bromberg | |
| 8,895,355 B2 | 11/2014 | Cao et al. | |
| 8,964,167 B2 | 2/2015 | Jeon et al. | |
| 9,024,631 B2 * | 5/2015 | Beach | G01R 33/1276 |
| | | | 324/204 |
| 9,093,377 B2 | 7/2015 | Cao et al. | |
| 9,236,293 B2 | 1/2016 | Cao et al. | |
| 2007/0237703 A1 | 10/2007 | Zhang et al. | |
| 2009/0160279 A1 * | 6/2009 | Baur | F16C 32/04 |
| | | | 310/90.5 |
| 2010/0024231 A1 * | 2/2010 | Peczalski | G01B 7/003 |
| | | | 33/355 R |
| 2010/0140213 A1 * | 6/2010 | Mizukami | B03C 1/08 |
| | | | 216/22 |
| 2011/0167909 A1 * | 7/2011 | Wagner | G01N 9/002 |
| | | | 73/32 A |
| 2011/0250406 A1 | 10/2011 | Zia | |
| 2012/0098534 A1 * | 4/2012 | Hertel | G01R 33/1292 |
| | | | 324/252 |
| 2014/0273449 A1 * | 9/2014 | Cao | H01L 21/02697 |
| | | | 438/674 |
| 2015/0287633 A1 | 10/2015 | Cao et al. | |

OTHER PUBLICATIONS

Kauffmann et al., "Contactless Dielectrophoretic Handling of Diamagnetic Levitating Water Droplets in Air," IEEE Transactions on Magnetics, vol. 46, No. 8, pp. 3293-3296 (Aug. 2010).

Chetouani et al., "Diamagnetic Levitation of Beads and Cells Above Permanent Magnets," International Solid-State Sensors, Actuators and Microsystems Conference, 2007 (Transducers 2007), pp. 715-718 (Jun. 2007).

English translation of JPH05219766A by Yasuhara Seiji; Sumitomo Heavy Industries (Aug. 27, 1993).

\* cited by examiner

VOLTAGE-TUNABLE 1D ELECTRO-MAGNET POTENTIAL AND PROBE SYSTEM WITH PARALLEL DIPOLE LINE TRAP

FIELD OF THE INVENTION

The present invention relates to parallel dipole line (PDL) trap systems, and more particularly, to techniques for manipulating objects and for determining the position of the objects in PDL trap systems.

BACKGROUND OF THE INVENTION

Electromagnetic and optical trap systems play an important role in physics: such as Penning trap, Linear Ion (Paul) trap, and atomic trap. They are used to isolate matter which enables various high precision measurements to extract the intrinsic property of the matter and to perform various fundamental experiments in physics.

One such system that has been recently developed is a parallel dipole line (PDL) trap. A PDL trap enables trapping of a diamagnetic cylindrical object using dipole line or transversely magnetized magnets due to the existence of a camelback magnetic potential along the longitudinal axis of the trap. See, for example, Gunawan et al., "A parallel dipole line system," Applied Physics Letters 106, pp. 062407-1-5 (February 2015) (hereinafter "Gunawan") and U.S. Pat. Nos. 8,895,355, 9,093,377, and 9,236,293 all issued to Cao et al., and entitled "Magnetic Trap for Cylindrical Diamagnetic Materials" (hereinafter "U.S. Pat. No. 8,895,355", "U.S. Pat. No. 9,093,377", and "U.S. Pat. No. 9,236,293", respectively).

Once contained in the trap, means are often needed to manipulate and detect the position of the object for various experiments and sensing applications. Accordingly, a simple technique to manipulate and detect the position of the trapped object in a PDL trap would be desirable.

SUMMARY OF THE INVENTION

The present invention provides techniques for manipulating objects and for determining the position of the objects in parallel dipole line (PDL) trap systems. In one aspect of the invention, a PDL trap is provided. The PDL trap includes: a pair of dipole line magnets connected to a potential, wherein the pair of dipole line magnets includes magnets having magnetizations perpendicular to long axes of the magnets; a diamagnetic rod levitating above the pair of dipole line magnets; and at least one electrode above the pair of dipole line magnets, adjacent to the diamagnetic rod. The system produces a hybrid one-dimensional electromagnetic potential which is tunable by voltage.

In another aspect of the invention, a method of operating a PDL trap is provided. The method includes the steps of: providing the PDL trap having a pair of dipole line magnets that includes magnets having magnetizations perpendicular to long axes of the magnets, a diamagnetic rod levitating above the pair of dipole line magnets, and at least one electrode above the pair of dipole line magnets, adjacent to the diamagnetic rod; and applying a bias voltage to the pair of dipole line magnets and the electrode to change an electric potential of the PDL trap and control a position of the diamagnetic rod in the PDL trap. The method can further include the step of: varying the bias voltage applied to the electrode to tune a one-dimensional potential along the PDL trap, wherein the one-dimensional potential includes a magnetic camelback potential term and an electric potential term, and wherein the electric potential term is tunable by the bias voltage applied to the electrode and thus by way of the varying the bias voltage applied to the electrode the position of the diamagnetic rod in the PDL trap can be varied.

In another aspect of the invention, another method of operating a PDL trap is provided. The method includes the steps of: providing the PDL trap having a pair of dipole line magnets that includes magnets having magnetizations perpendicular to long axes of the magnets, and at least one electrode above the pair of dipole line magnets; connecting a capacitance meter to the electrode and to the pair of dipole line magnets; measuring capacitance of the PDL trap using the capacitance meter to determine a base capacitance $C_0$; inserting a diamagnetic rod into the PDL trap, such that the diamagnetic rod levitates above the pair of dipole line magnets; measuring the capacitance of the PDL trap using the capacitance meter with the diamagnetic rod fully underneath the electrode: $\Delta C$; measuring the capacitance of the PDL trap using the capacitance meter for any position z of the diamagnetic rod in the PDL trap: $C(z)$; and determining the position z of the diamagnetic rod in the PDL trap using $C_0$, $\Delta C$ and $C(z)$.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for a parallel dipole line (PDL) trap system that uses voltage biased electrodes to yield a voltage-tunable one dimensional (1D) potential for an object contained in the trap (trapped object). This technique is useful for manipulating (i.e., moving) the trapped object within the trap, serves as a linear actuator, to perform various experiments and to explore the physics in 1D potential.

The present techniques also provide a technique to detect the position of the trapped object in the PDL trap using one or more metal electrodes and a capacitance measurement system. As will be described in detail below, the electrode(s) are placed on top of the PDL trap aligned along its longitudinal axis. The capability of measuring the position of the trapped object is useful for many sensing applications.

The details of a PDL trap system as they pertain to the present techniques will become apparent from the description provided below. In general however, a PDL trap consists of a magnetic parallel dipole line system made of a pair of transversely magnetized (also called diametric) magnets that naturally join together. The magnets have an elongated shape such as a cylinder, bar, or stripe, whose magnetization is in the transverse direction (perpendicular to the long axis). See, for example, FIG. 17 (described below). These magnets will be referred to herein as "dipole line" or "diametric" magnets. A diamagnetic cylindrical object such as a graphite rod can be trapped at the center. See, for example, Gunawan, U.S. Pat. No. 8,895,355, U.S. Pat. No. 9,093,377, and U.S. Pat. No. 9,236,293 the contents of each of which are incorporated by reference as if fully set forth herein. The diamagnetic cylindrical object will levitate above the pair of diametric magnets. The key discovery and the central feature of the PDL trap is the existence of "camelback magnetic potential" along the longitudinal (z-axis), i.e., magnetic field enhancement near the edge of the dipole line which occurs for cylindrical diametric magnet with length $L>2.5a$, wherein a is the radius of the magnet.

Figure 1:
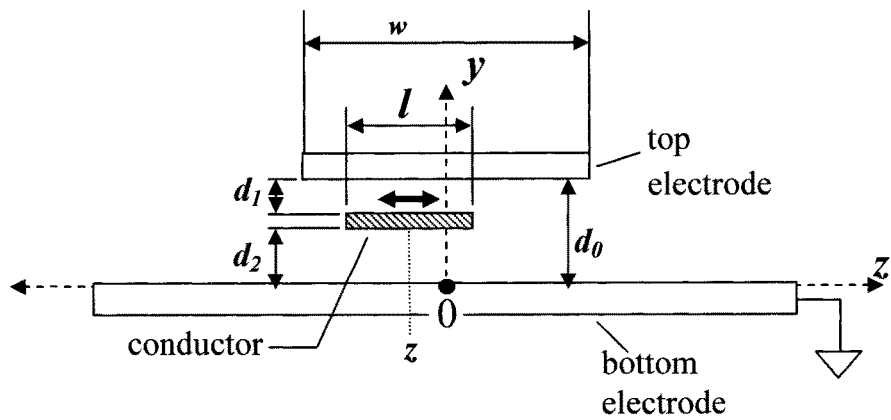
FIG. 1 is a diagram illustrating a parallel plate capacitor model according to an embodiment of the present invention.
Figure 2:
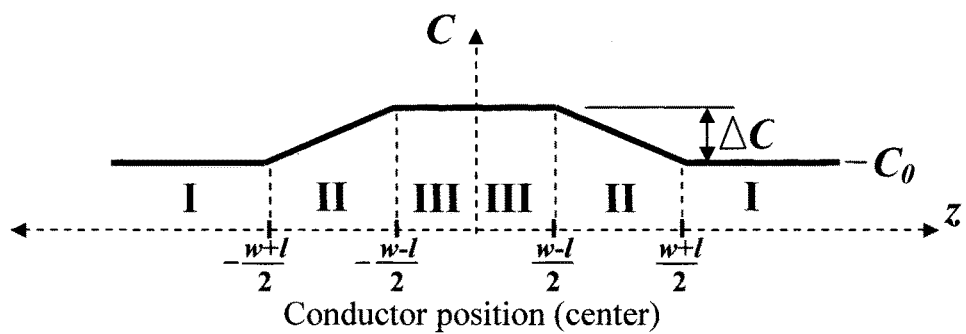
FIG. 2 is a plot illustrating capacitance as a function of a conductor position in the parallel plate capacitor model according to an embodiment of the present invention.

The principles of operation used in the present voltage-tunable 1D electro-magnet potential are now described by way of reference to FIGS. 1 and 2. Referring first to FIG. 1, a parallel plate capacitor model is shown consisting of a top electrode plate (labeled "top electrode"), a bottom electrode plate (labeled "bottom electrode"), and a conductor plate (labeled "conductor") that freely moves along the z-axis at constant spacing $d_1$ and $d_2$ between the top and bottom electrodes ($d_0$ is the spacing between the top and bottom electrodes). The length of the conductor l and the width of the top electrode w are labeled in FIG. 1. As shown in FIG. 1, the bottom electrode is connected to ground.

For the model shown in FIG. 1, the capacitance (per unit length) as a function of the conductor center position (z) is given as:

$$C(z) = \varepsilon_0 \begin{cases} \dfrac{w}{d_0} & |z| > (w+l)/2 \\ \dfrac{z+w/2}{d_1+d_2} + \dfrac{w/2-z}{d_0} & (w-l)/2 < |z| < (w+l)/2, \\ \dfrac{l}{d_1+d_2} + \dfrac{w-l}{d_0} & |z| < (w+l)/2 \end{cases} \quad (1)$$

wherein $|z|$ is the absolute value of z. A plot of this function is shown in FIG. 2.

As shown in FIG. 2, the capacitance of the system increases as the conductor enters in between the (top and bottom) electrode plates. This happen because the conductor screens out all electric fields, thus effectively making the spacing $d_0$ between the (top and bottom) electrode plates smaller.

If it is assumed that an isolated system and plate is charged by amount Q and the energy of the capacitor is: $U_C = Q^2/2C$. This means that the internal energy is lower when the conductor is in between the electrode plates, implying that, if the conductor freely moves, it will be attracted towards the center of the capacitor.

Figure 3:
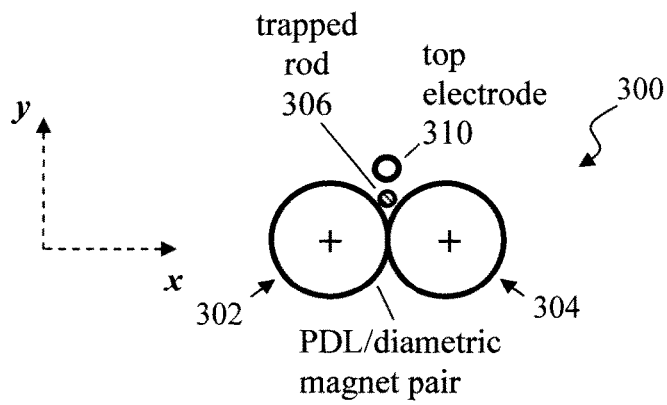
FIG. 3 is a cross-sectional diagram of the present voltage-tunable 1D electro-magnet potential with parallel dipole line (PDL) trap system according to an embodiment of the present invention.
Figure 4:
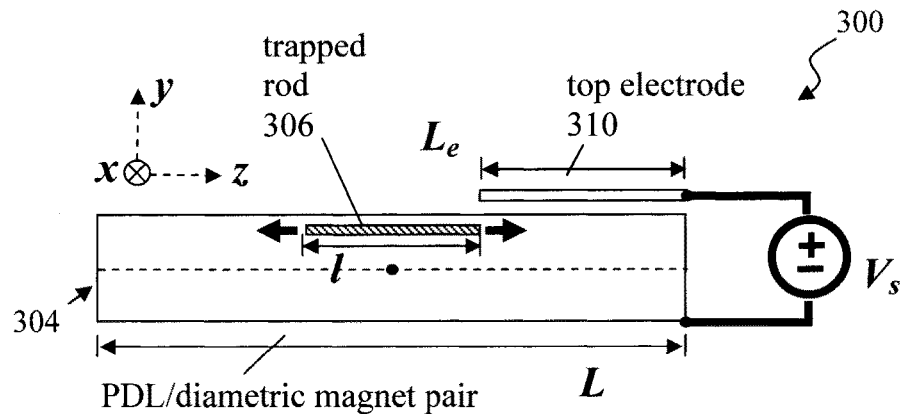
FIG. 4 is a side-view of the present voltage-tunable 1D electro-magnet potential with PDL trap system according to an embodiment of the present invention.
Figure 5:
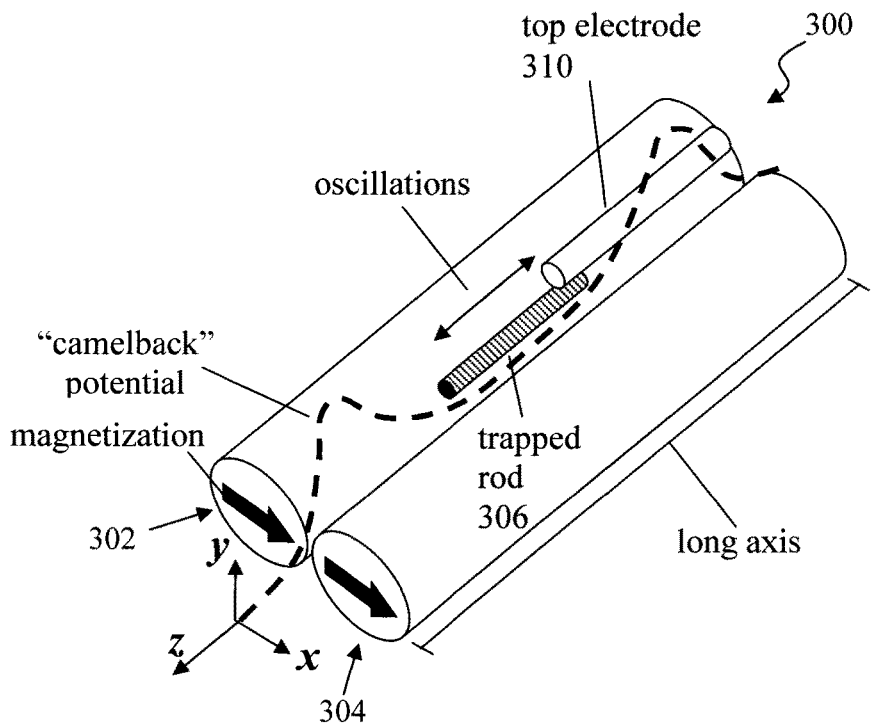
FIG. 5 is a three-dimensional view of the present voltage-tunable 1D electro-magnet potential with PDL trap system according to an embodiment of the present invention.

FIGS. 3-5 are diagrams illustrating a setup of the present system. Specifically, FIG. 3 shows a cross-sectional view, FIG. 4 shows a side view, and FIG. 5 shows a three-dimensional (3D) view of the present voltage-tunable 1D electro-magnet potential with parallel dipole line trap system.

Referring to FIG. 3, it is shown that the present voltage-tunable 1D electro-magnet potential with parallel dipole line trap system 300 includes a magnetic parallel dipole line (PDL) trap system. In the example shown, the PDL trap system consists of a pair of transversely magnetized cylindrical magnets 302 and 304. A diamagnetic rod 306 is the trapped object in the trap system and which levitates above the magnets 302 and 304. As will be described in detail below, the diamagnetic rod 306 might be a graphite rod (e.g., a commercially available mechanical pencil lead) or any other diamagnetic materials.

A top metal electrode 310 (e.g., copper (Cu), aluminum (Al), brass or other non-magnetic metals) is present over the PDL trap system, such that the diamagnetic rod 306 is between the top electrode 310 and the magnets 302 and 304. The top electrodes are mounted to fixtures (not shown for ease and clarity of depiction) on the sides of the trap. The diamagnetic rod 306 can freely pass between the top electrode 310 and the magnets 302 and 304 without touching either the electrode or the magnets (i.e., the diamagnetic rod 306 is levitated above the magnets). A key is provided to orient the depictions of the system along the x, y, and z axes.

For instance, FIG. 4 depicts the present voltage-tunable 1D electro-magnet potential with parallel dipole line trap system 300 from a side view, which illustrates how the magnets 302 and 304 have a length L, the diamagnetic rod 306 has a length l, and the top electrode 310 has a length $L_e$ along the z-axis. FIG. 4 also illustrates how the trapped diamagnetic rod 306 can oscillate back and forth along the z-axis between the top electrode 310 and the magnets 302 and 304. As shown in FIG. 4, a voltage source $V_S$ is connected to the top electrode 310 with the magnets 302 and 304 as ground (i.e., both magnets 302 and 304 are grounded together).

As will be described in detail below, this voltage source can be used to apply a voltage bias to control the position of the trapped diamagnetic rod 306. Namely, the voltage bias will perform some work as the diamagnetic rod 306 gets attracted to the center of the top electrode 310. At any given bias voltage V the system electrostatic energy ($U_E$) is given as:

$$U_E = -1/2 C(z) V^2, \qquad (2)$$

wherein C(z) is the capacitance that depends on the rod (centroid) position z (as will be explained in FIG. 11 and Equation 7). When the top electrode 310 is biased with a higher voltage, the diamagnetic rod 306 gets pulled in between the top electrode 310 and the magnets 302 and 304.

FIG. 5 provides a 3D depiction of the present voltage-tunable 1D electro-magnet potential with parallel dipole line trap system 300. As shown in FIG. 5, a "camelback magnetic potential" exists in the PDL trap along the longitudinal (z-axis). This permits the trapped diamagnetic rod 306 to oscillate back and forth along the z-axis. The strength of the bias voltage applied to top electrode 310 can be used to control the position of the diamagnetic rod 306 between the top electrode 310 and the magnets 302 and 304 (i.e., increasing the bias voltage serves to draw the diamagnetic rod 306 between the top electrode 310 and the magnets 302 and 304). As also shown in FIG. 5, according to an exemplary embodiment, the top electrode 310 can be configured as a cylindrical rod. Further, as provided above, the magnets have an elongated shape (e.g., a cylinder in the example shown in FIG. 5), whose magnetization is in the transverse direction (i.e., the magnetization is perpendicular to the long axis of the magnets—see FIG. 5).

In a first exemplary embodiment, the present techniques are used to control/manipulate (i.e., actuate) the diamagnetic rod 306 trapped in the PDL system 300. The principles of operation behind this "tunable" PDL trap system are now described by way of reference to FIG. 6. The PDL trap with top electrode yields a tunable 1D hybrid electromagnetic potential system with two components:

(1) Magnetic potential (the camelback PDL potential):

$$U_M(z) = -\frac{\chi}{2+\chi} \frac{V_R}{\mu_0} B_{PDL}(z)^2 \qquad (3)$$

(2) Electric potential (capacitive potential) tunable by voltage V:

$$U_E(z) = -1/2 C(z) V^2 \qquad (4)$$

Thus, the final total energy is:

$$U_T(z) = -\frac{\chi}{2+\chi} \frac{V_R}{\mu_0} B_{PDL}(z)^2 - \frac{1}{2} C(z) V^2, \qquad (5)$$

wherein $V_R$ is the volume of the rod, $\chi$ is the magnetic susceptibility of the diamagnetic rod 306, the physical constant $\mu_0$ is the magnetic permeability of vacuum, C(z) is the magnet and rod system capacitance that depends on the geometry of the electrode (e.g., Equation 7 for the case shown in FIGS. 10 and 11) and V is the voltage bias.

Figure 6:
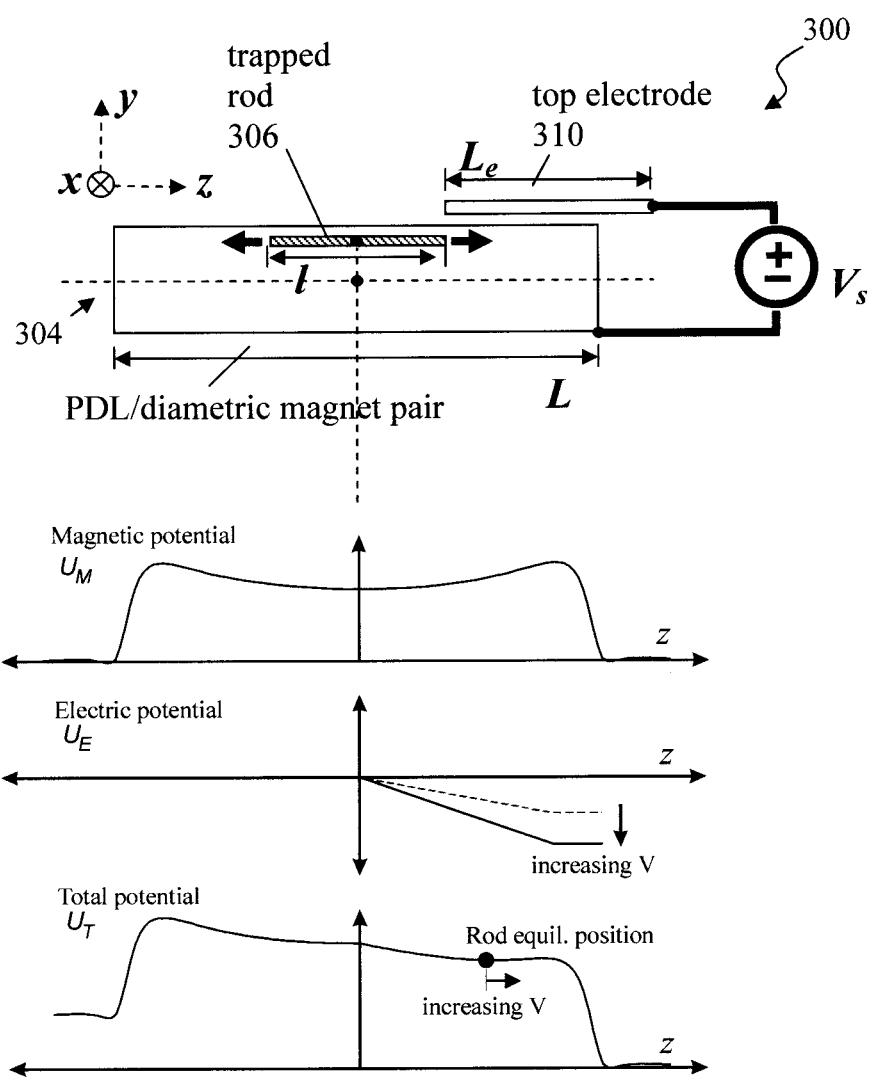
FIG. 6 is a diagram illustrating the electrical and magnetic potentials in the present PDL trap system according to an embodiment of the present invention.

The magnetic and electrical potentials described by equations 3-5, above, are illustrated in FIG. 6. As shown in FIG. 6, the magnetic camelback potential (Equation 3) provides the base confinement for the PDL trap. With increasing voltage there is a negative electrostatic potential contribution underneath the electrode that pulls the trapped diamagnetic rod 306 to the right. In other words, with increasing voltage bias the minimum of the total electromagnetic camelback potential shifts to the right. This yields a voltage-controlled tunable 1D potential and can be used to control the position of the trapped diamagnetic rod 306 with the voltage bias.

The magnetic field of the PDL trap that gives rise to the camelback potential, using a cylindrical diametric magnet pair field model, is given in Gunawan as:

$$B_{PDL}(z) = B_M(-a, y_0, z) + B_M(a, y_0, z) \qquad (6)$$

$$B_M = (x, y, z) = \frac{\mu_0 M a}{4\pi}$$

$$\int_0^{2\pi} \sum_{n=1,2} \frac{(-1)^n \left[ x - a\cos\phi, y - a\sin\phi, u_n + \sqrt{u_n^2 + s^2} \right] \cos\phi \, d\phi}{u_n^2 + s^2 + u_n \sqrt{u_n^2 + s^2}},$$

wherein $s^2 = (x - a \cos \phi)^2 + (y - a \sin \phi)^2$ and $u_{1,2} = z \pm L/2$, and $y_0$ is the equilibrium height of the rod.

Thus, referring to FIG. 6 trapped diamagnetic rod 306 will (without influence from the top electrode 310) be centered in the PDL system due to the symmetric magnetic camelback potential that has minimum at the center. With a bias voltage applied, the top electrode 310 (which is placed off-center above the trap) will draw the diamagnetic rod 306 (between the top electrode 310 and the magnets 302/304) towards the side of the trap where the top electrode 310 is. Conversely, when the bias voltage is reduced or removed, the diamagnetic rod 306 will (based on the camelback magnetic potential) move back towards the center of the PDL trap. This embodiment represents the simplest form anticipated herein for actuating the trapped diamagnetic rod 306. Some notable variations on this design are now described.

Figure 7:
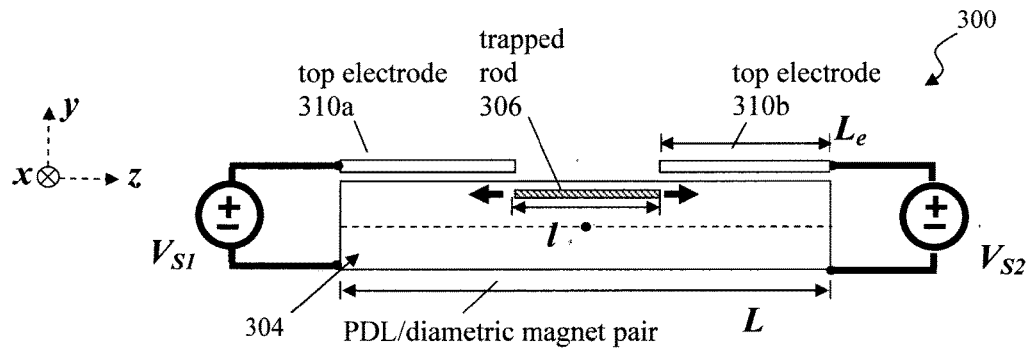
FIG. 7 is a side-view of a variation on the present voltage-tunable 1D electro-magnet potential with PDL trap system having two top electrodes according to an embodiment of the present invention.

For instance, as shown in FIG. 7 multiple top electrodes (310a and 310b) may be employed, each having its own (independently controlled) voltage source $V_{S1}$ and $V_{S2}$. In this example, the top electrodes 310a and 310b are located over opposite ends of the PDL trap. In the same basic manner as described above, a bias voltage can be used to draw the trapped diamagnetic rod 306 towards the side of the trap where the biased top electrode is. Here however, one of the top electrodes is used to move/actuate the trapped diamagnetic rod 306 in one direction and the other top electrode is used to move/actuate the trapped diamagnetic rod 306 in the other, opposite direction. Compare, for example, the single electrode embodiment above, where the trapped diamagnetic rod 306 is moved in one direction by the top electrode 310, and then back to the center of the trap via the magnetic potential. Using two electrodes as shown in FIG. 7 doubles the range of position for the trapped rod. In the case of a two electrode embodiment, the trapped diamagnetic rod 306 will (without influence from the top electrode 310) be centered in the PDL system (based on the "camelback") magnetic potential. With a bias voltage $V_{S1}$ applied, the top electrode 310a will draw the diamagnetic rod 306 (between the top electrode 310a and the magnets 302/304) towards the side of the trap where the top electrode 310a is (i.e., to the left side of the PDL trap in this case). When the bias voltage $V_{S1}$ is removed, the diamagnetic rod 306 will (based on the magnetic potential) move back towards the center of the PDL trap. With a bias voltage $V_{S2}$ applied, the top electrode 310b will draw the diamagnetic rod 306 (between the top electrode 310b and the magnets 302/304) towards the side of the trap where the top electrode 310b is (i.e., to the right side of the PDL trap in this case).

Figure 8:
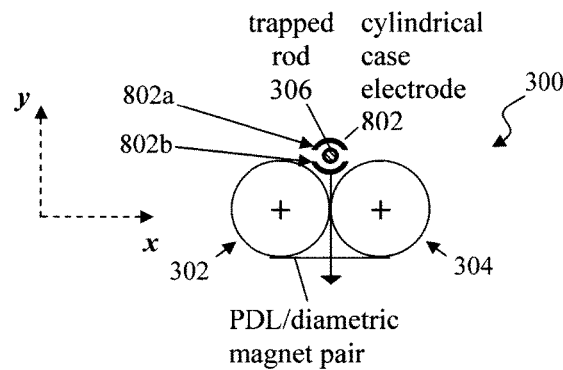
FIG. 8 is a cross-sectional diagram of a variation of the present voltage-tunable 1D electro-magnet potential with PDL trap system having a cylindrical case electrode according to an embodiment of the present invention.
Figure 9:
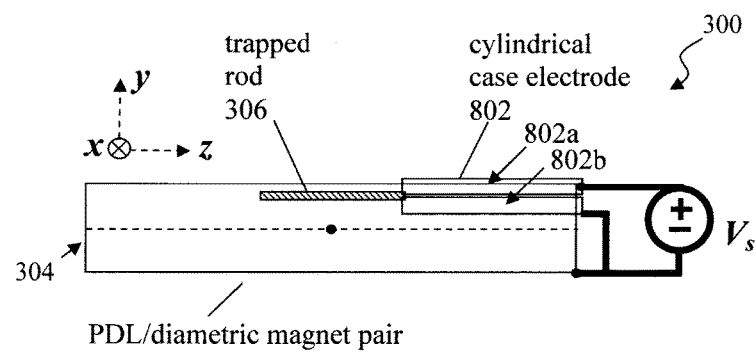
FIG. 9 is a side-view of the present voltage-tunable 1D electro-magnet potential with PDL trap system having a cylindrical case electrode according to an embodiment of the present invention.

Another variation on the present PDL trap design is shown in FIGS. 8 and 9. FIG. 8 is a cross-sectional view and FIG. 9 is a side-view. In this exemplary embodiment, the top electrode(s) is/are configured to at least partially surround the trapped diamagnetic rod 306. For instance, as shown in FIG. 8, the top electrode 802 is composed of two semicircular halves 802a and 802b. The two halves 802a and 802b, which are in a non-contact position relative to one another, partially surround the diamagnetic rod 306 (i.e., such that the diamagnetic rod 306 is present between the two halves 802a and 802b). This electrode configuration is referred to herein as a cylindrical case electrode. By comparison with the designs described above, as shown in FIG. 8 the cylindrical case electrode configuration places the electrodes both above and below the trapped diamagnetic rod 306. Thus, according to the present techniques, the electrodes are above the pair of dipole line magnets and adjacent to (i.e., above and/or below) the diamagnetic rod.

FIG. 9 is a side-view of the PDL trap with the cylindrical case electrode structure. As shown in FIG. 9, a bias voltage $V_S$ is connected to each halves 802a and 802b of the cylindrical case electrode 802. An advantage to the cylindrical case electrode design is that it enhances the capacitance value and coupling, and thus reduces the voltage requirement. The cylindrical cases and the trapped rod can be made to have a small gap thus increasing its capacitance. The gap is in between the rod and the cylindrical case and has comparable dimensions with the radius of the trapped rod. As the induced charge in the capacitor is given as: Q=CV, to obtain the same amount of induced charge (and thus force) the voltage required is less.

As provided above, the present techniques also provide an object detection feature, wherein a position of the trapped object is detected using the measurements via the electrode(s). Thus, the present PDL trap system can also serve as a probe. The position of the trapped object in the system can be useful in a number of different applications. For instance, as described in U.S. patent application Ser. No. 14/826,934 by Gunawan et al., entitled "Parallel Dipole Line Trap Viscometer and Pressure Gauge," the contents of which are incorporated by reference as if fully set forth herein, oscillations of the trapped rod are used to analyze a gas in the ambient. The present techniques provide a viable alternative method for detecting the positioning of the rod in that system.

Two configurations are provided herein for detecting position of the trapped rod, i.e., a single electrode probe system, and a multiple electrode/capacitance bridge system.

Figure 10:
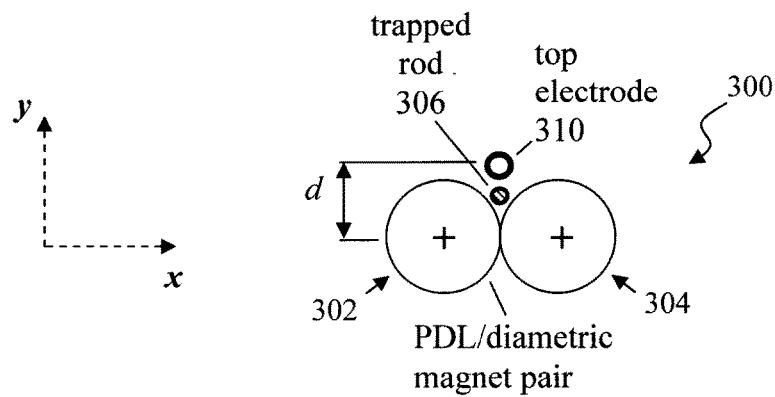
FIG. 10 is a cross-sectional view of a PDL trap system having a single electrode probe for detecting a position of the trapped rod according to an embodiment of the present invention.

For ease and consistency of depiction, the same components of the present PDL trap system will be numbered alike in the following figures. Referring to FIGS. 10 and 11, the first configuration is depicted having a single electrode. FIG. 10 provides a cross-sectional view, and FIG. 11 provides a side view. The PDL trap system 300 here has the same basic configuration as above, namely a PDL trap with a pair of diametric magnets 302 and 304, a diamagnetic rod 306 as a trapped object, and a (e.g., cylindrical) top electrode 310 present over the PDL trap, and wherein the diamagnetic rod 306 can pass between the PDL trap and the top electrode 310.

Figure 11:
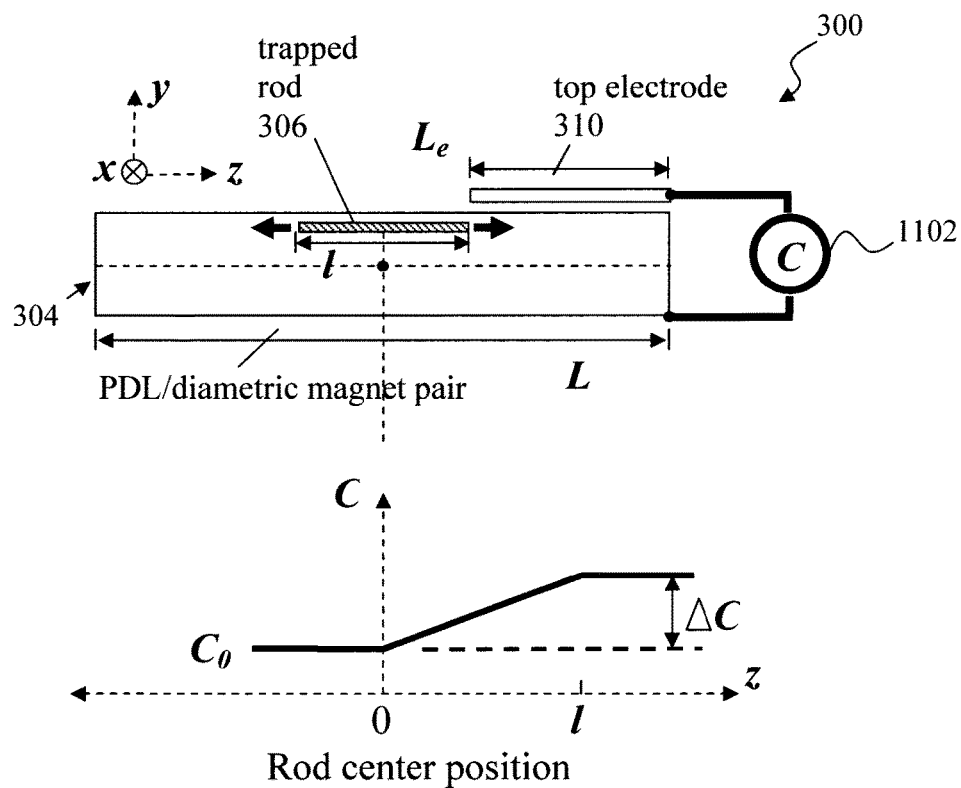
FIG. 11 is a side-view of the PDL trap system having a single electrode probe for detecting a position of the trapped rod, and a plot of capacitance relative to a position of the trapped rod according to an embodiment of the present invention.

Referring to FIG. 11, the difference in this case is that there is a capacitance meter 1102 connected to the magnets of the PDL trap and to the top electrode 310, and is configured to measure the capacitance between the magnets 302/304 and the top electrode 310. Namely, as shown in FIG. 11, as the position of the diamagnetic rod 306 in the PDL trap varies, its capacitance changes in the range of 0<z<l, wherein z is the centroid position of the diamagnetic rod 306 and l is the length of the rod 306.

The capacitance of the system shown in FIGS. 10 and 11 is given as follows:

$$C(z) = \begin{cases} C_0 & z < 0 \\ C_0 + \Delta C z/l & 0 < z < l \\ C_0 + \Delta C & z > l \end{cases} \quad (7)$$

wherein $C_0$ is the base capacitance when there is no rod, and $\Delta C$ is the maximum change in capacitance that occurs when the rod is completely underneath the electrode. Thus, the position of the rod centroid z can be determined from the measured capacitance for 0<z<l.

Figure 12:
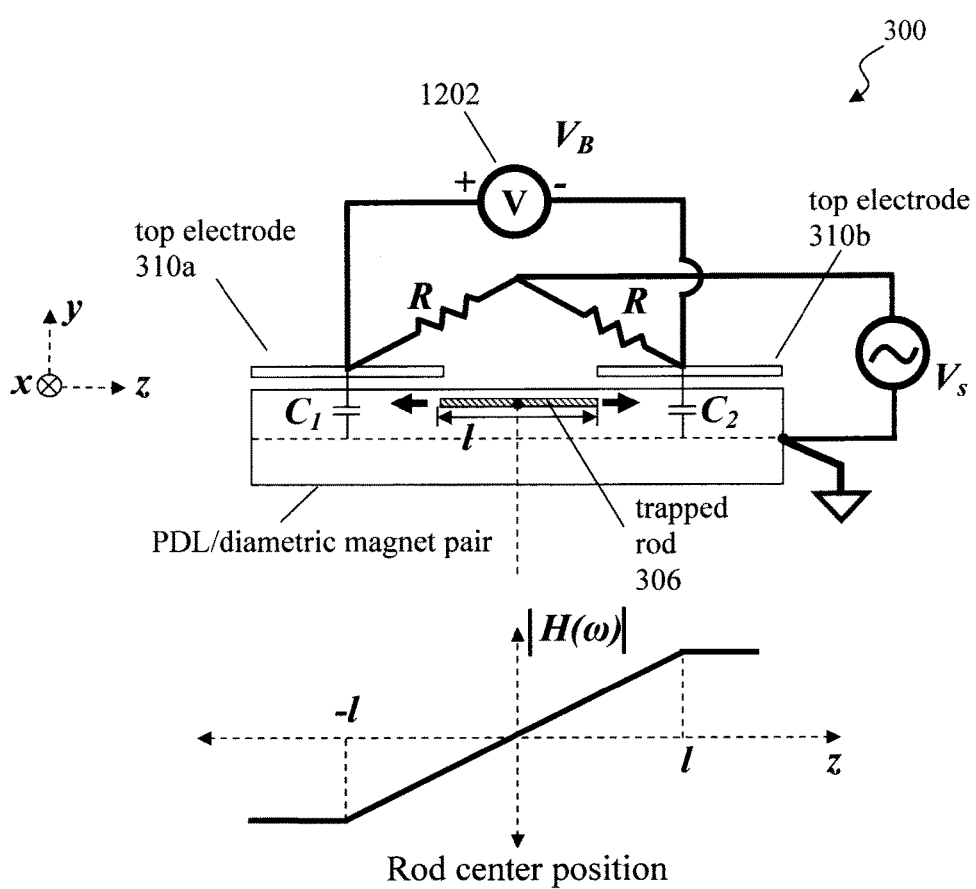
FIG. 12 is a side-view of a PDL trap system having two electrode probes for detecting a position of the trapped rod, and a plot of capacitance bridge voltage relative to a position of the trapped rod according to an embodiment of the present invention.

In the example depicted in FIGS. 10 and 11, the single top electrode 310 is positioned off to one side of the PDL trap. One potential drawback to this set-up is that the specific position of the diamagnetic rod 306 can only be detected when the diamagnetic rod 306 is present between the PDL trap and the top electrode 310. To address this limitation, a multiple electrode variation of the present detection system is depicted (in side view) in FIG. 12. In this example, two electrodes 310a and 310b are located above opposite ends of the PDL trap. The edge of each electrode is aligned with the end of the rod at equilibrium position as shown in FIG. 12. Resistors (R) form a double resistor-capacitor RC bridge with the top electrodes 310a and 310b. As is known in the art, a bridge circuit contains two circuit branches that are bridged by a third branch. An AC voltage source $V_S$ is connected to the double RC bridge and to the magnets 302/304 as the ground. An AC voltmeter 1202 is connected to the top electrodes 310a and 310b. The R-C network in each branch serves as a voltage divider; thus by measuring the differential voltage between the electrodes one can measure the voltage imbalance in the bridge and deduce the rod displacement.

As shown in FIG. 12, as the position of the diamagnetic rod 306 in the trap varies, the bridge voltage $V_B$ (as measured by AC voltmeter 1202) changes in the range of |z|<l wherein |z| means absolute value of z and z is the centroid position of the diamagnetic rod 306, and l is the length of the diamagnetic rod 306. Here $C_1$ and $C_2$ are the capacitance of the left and right electrode which depends on the position of the rod.

The transfer function of the RC bridge in phasor expression is given as:

$$\frac{V_B}{V_S} = H(\omega, z) = \frac{j\omega R \Delta C z/l}{(1 + j\omega R C_0)[1 + j\omega R(C_0 + \Delta C|z|/l)]} \quad (8)$$

for the range of $|z|<1$. $C_0$ is the capacitance of each electrode when there is no rod, and $\Delta C$ is the maximum change of capacitance in each electrode when the rod is completely underneath. Thus, the position of the rod (z) can be determined from the capacitance bridge voltage $V_B$ for $|z|<1$.

Figure 13:
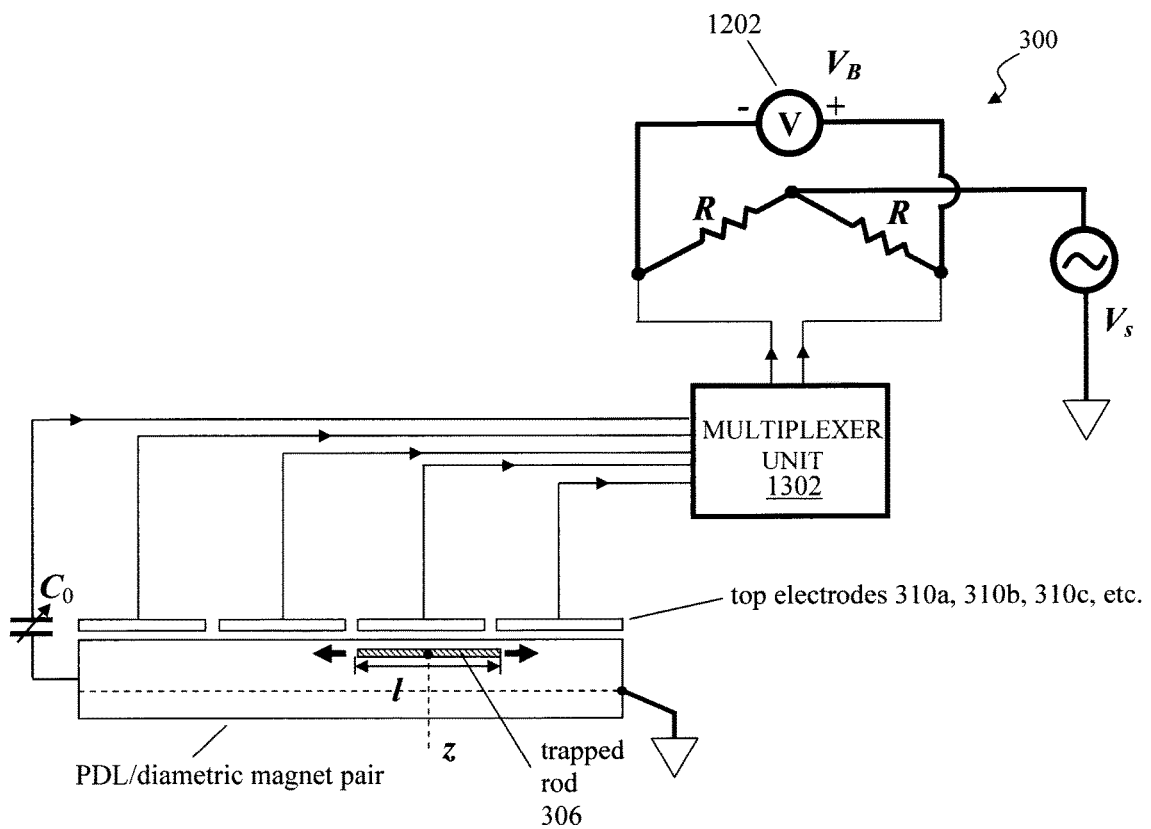
FIG. 13 is a side-view of a PDL trap system having multiple (i.e., more than two) electrode probes for detecting a position of the trapped rod according to an embodiment of the present invention.

Some advantages to the multiple electrode configuration (FIG. 12) over the single electrode scenario (FIGS. 10 and 11) are: first the dynamic range of position detection is twice as large, i.e., 2l instead of l, since the electrodes are present over more than one end of the PDL trap. Second, the system also allows higher resolution and precision detection due to the following factors: (1) the system measures voltage—which is easier and simpler and can be done with higher accuracy that capacitance measurement; (2) the system uses ac signal—which allows band pass filtering for noise reduction or high precision lock-in detection; and (3) $V_B$ is a differential voltage that is nominally zero when the rod is at equilibrium position z=0. This allows detection of small signal with high resolution. Still, the position of the diamagnetic rod 306 can only be precisely detected when the diamagnetic rod 306 is present between either top electrodes 310a and 310b and the PDL trap. Thus, embodiments are anticipated herein where multiple (i.e., more than 2) top electrodes are present over the PDL trap. See, for example, FIG. 13. As shown (by way of a side-view) in FIG. 13, the same basic set-up is employed as in FIG. 12 wherein the position of the rod (z) is determined from the capacitance bridge voltage $V_B$. The difference here is that multiple top electrodes 310a, 310b, 310c, etc. are positioned above the PDL trap. As shown in FIG. 13, the top electrodes 310 are spaced apart from one another by a distance s. There is a tunable capacitor $C_0$ that is set to be equal to the electrode capacitance when there is no rod. $C_0$ serves as a reference capacitor. The electrodes 310 are connected to a multiplexer unit 1302 with two output channels. As is known in the art, a multiplexer circuit coordinates multiple signals from multiple input lines towards a single output line. First, the RC bridge and the multiplexer compare all the electrodes with respect to the reference capacitance $C_0$ and identify two electrodes (#1 and #2) that have larger capacitance than the reference capacitance. This implies that the rod cannot be completely under one electrode, i.e., the rod has to be partially under two electrodes—so that the differential capacitive signal (between the two electrodes (#1 and #2)) can be measured—see below. This also implies that the length of the rod is longer than the length of the electrode. Second, the RC bridge is connected to the two electrodes and measures the voltage $V_B$ and calculates the position z in the way described above. Thus, by employing multiple top electrodes 310, the rod detection can be expanded over the whole length of the PDL trap.

Figure 14:
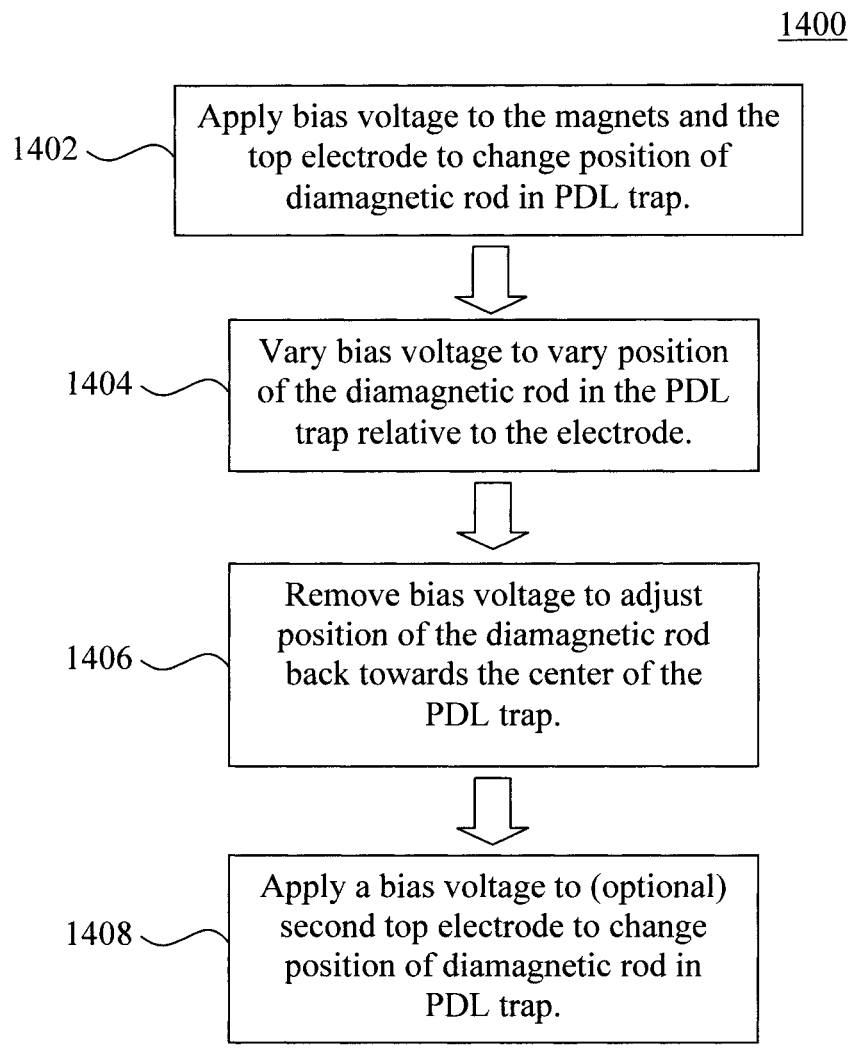
FIG. 14 is a diagram illustrating an exemplary methodology for manipulating a position of the trapped rod in the present PDL trap system according to an embodiment of the present invention.
Figure 15:
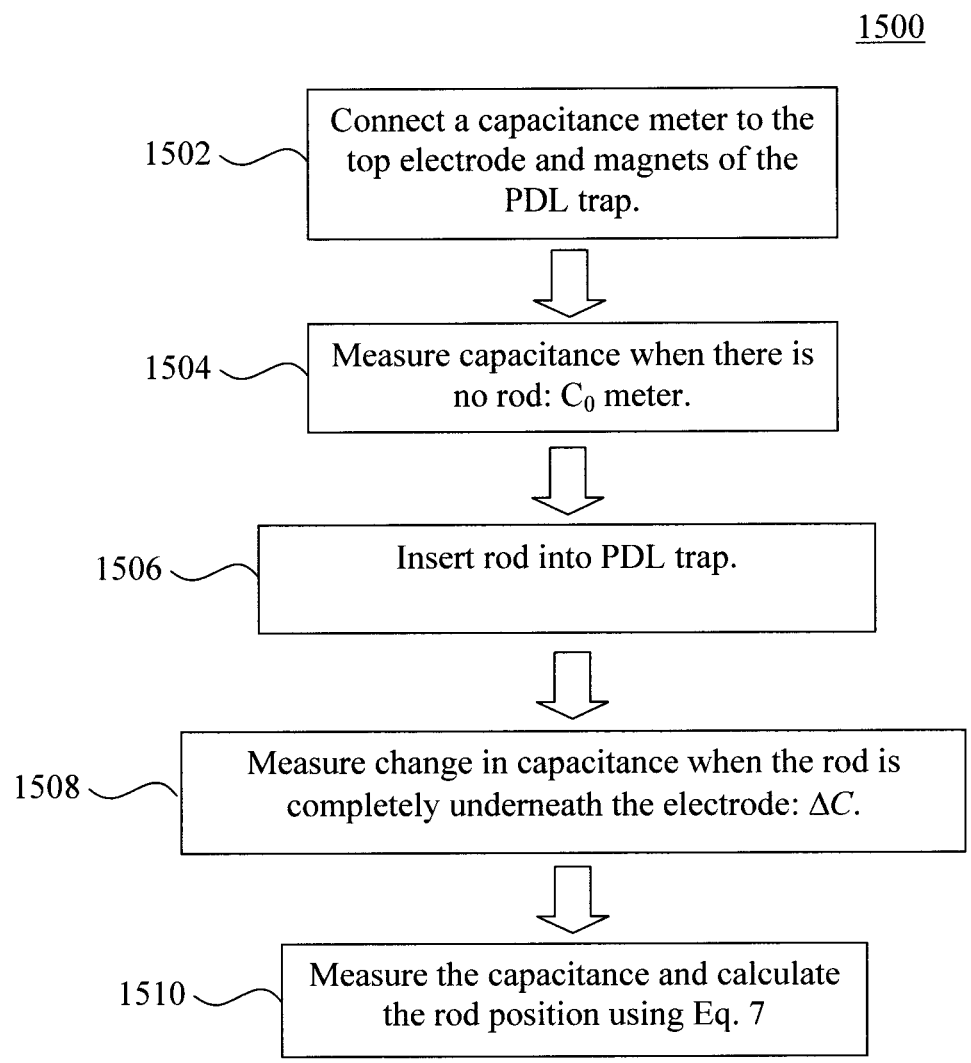
FIG. 15 is a diagram illustrating an exemplary methodology for determining a position of the trapped rod in the present PDL trap system according to an embodiment of the present invention.
Figure 16:
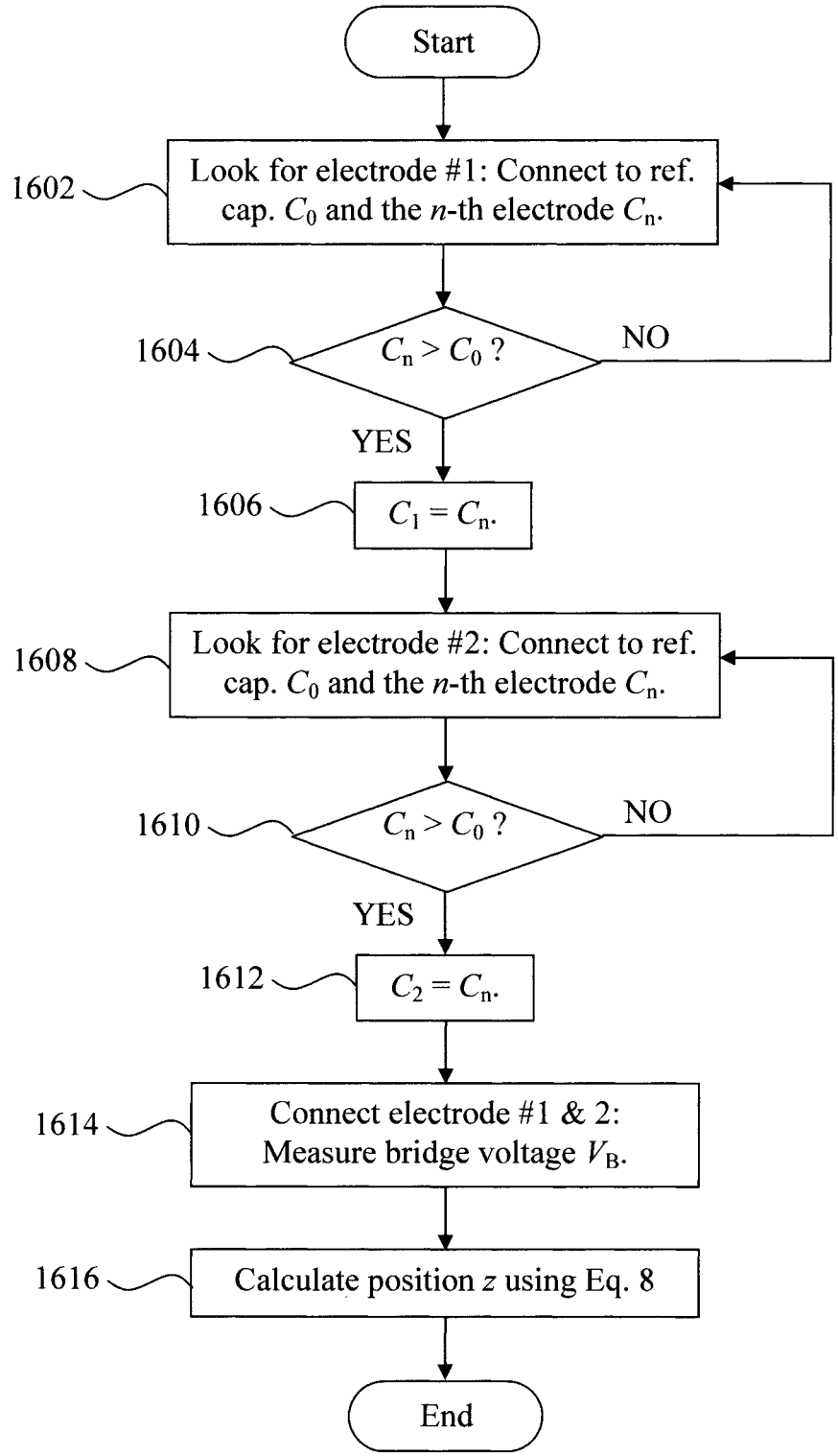
FIG. 16 is a diagram illustrating another exemplary methodology for determining a position of the trapped rod in the present PDL trap system using the multi-electrode scheme of FIG. 13 according to an embodiment of the present invention.

Given the above-described embodiments, FIGS. 14-16 provide exemplary methodologies for using the present PDL trap designs to manipulate and/or detect the position of the trapped object. For instance, FIG. 14 provides an exemplary methodology 1400 for manipulating the trapped diamagnetic rod 306 in the present PDL traps. As described above, the present PDL traps include a pair of diametric cylindrical magnets 302 and 304, the diamagnetic rod 306 levitating above the pair of diametric magnets, and at least one electrode present over the pair of diametric magnets. Due to the symmetric camelback magnetic potential, the diamagnetic rod 306 will rest at the center of the PDL trap. In step 1402, a bias voltage $V_S$ is applied to the pair of diametric magnets and the at least one electrode to draw the diamagnetic rod 306 towards the electrode (with the applied voltage) thereby changing the position of the diamagnetic rod 306 in the PDL trap. As provided above, the top electrode 310 can be present off center (i.e., to one side of the PDL trap). Thus, applying the bias voltage to the top electrode 310 will draw the diamagnetic rod 306 from the center of the PDL trap towards the side of the PDL trap where the top electrode is present, and the diamagnetic rod will pass between the top electrode 310 and the magnets 302/304.

In step 1404, the bias voltage applied to the magnets and to the electrode can be varied to change an electric potential of the PDL trap and control/vary the position of the diamagnetic rod 306 in the PDL trap. As provided above, a higher bias voltage will draw the diamagnetic rod 306 farther under the top electrode 310. In step 1406, the bias voltage can be removed to adjust the position of the diamagnetic rod 306 back towards the center of the PDL trap.

Steps 1402-1406 apply whether the single, double, or case electrode configuration is being employed. In the case of double top electrodes, as provided above, the two top electrodes can be located over opposite ends of the PDL trap. In that case, in step 1408, a second bias voltage $V_{S2}$ (with the bias voltage applied in step 1402 being a first bias voltage $V_{S1}$) can be applied to the pair of diametric magnets and to the second top electrode 310b (with the electrode in step 1402 being a first electrode 310a) to draw the diamagnetic rod 306 towards the second top electrode 310b thereby changing the position of the diamagnetic rod 306 in the PDL trap. When the top electrodes 310a and 310b are located at opposite ends of the PDL trap, steps 1402-1408 can be used to move the diamagnetic rod 306 from one end of the PDL trap to the other.

FIG. 15 provides an exemplary methodology 1500 for detecting a position of the trapped diamagnetic rod 306 in the present PDL traps. As provided above, the object position detection is enabled through the use of capacitance meter 1102 connected to the top electrode and the magnets 302/304 and/or through the use of a voltage meter 1202 connected to (multiple) top electrodes. Thus, in the former case, in step 1502, a capacitance meter 1102 is connected to the top electrode and the magnets 302/304. The first task is to determine the capacitance of the electrode without and with the rod: $C_0$ and $C_0 + \Delta C$, respectively.

Capacitance is measured (via capacitance meter 1202) when there is no rod to determine $C_0$ (step 1504), a rod is inserted in the trap (step 1506), and capacitance is measured again when the rod is completely underneath the top electrode to determine the change in the capacitance $\Delta C$ (step 1508). The capacitance can then be measured at any given position of the rod (1510) and using Equation 8 (above) the position z of the rod can be calculated. As shown in FIG. 11, described above, the capacitance increases as the diamagnetic rod 306 passes between the top electrode and the PDL magnets. The capacitance is at its lowest when no portion of the diamagnetic rod 306 is present between the top electrode and the PDL magnets. The capacitance will increase as more of the diamagnetic rod 306 passes between the top electrode and the PDL magnets, and will reach its maximum when all of the diamagnetic rod 306 is present between the top electrode and the PDL magnets.

FIG. 16 provides an exemplary methodology 1600 for detecting a position of the trapped rod using the multi-electrode scheme as shown in FIG. 13. In step 1602, the first task is to look for the first electrode (i.e., electrode #1) where the rod is located. This can be done by connecting the RC bridge to the reference capacitor $C_0$ and the n-th electrode. A determination is then made in step 1604 as to whether the capacitance of the n-th electrode, i.e., $C_n$, is greater than the reference capacitor $C_0$. If it is determined in step 1604 that (NO) the capacitance of the n-th electrode is not greater than the reference capacitor, then another electrode is selected and the process is repeated to compare its capacitance to the reference capacitor.

On the other hand, if it is determined in step 1604 that (YES) the n-th electrode has a higher capacitance than the reference capacitor, then the rod is present underneath the n-th electrode and in step 1606 this becomes the electrode #1. The process is then repeated to find the electrode #2 (during this measurement the rod position is fixed and can be anywhere in the trap). Namely, in step 1608 the RC bridge is connected to the reference capacitor $C_0$ and the n-th electrode. A determination is then made in step 1610 as to whether the capacitance of the n-th electrode, i.e., $C_n$, is greater than the reference capacitor $C_0$. If it is determined in step 1610 that (NO) the capacitance of the n-th electrode is not greater than the reference capacitor, then another electrode is selected and the process is repeated to compare its capacitance to the reference capacitor. On the other hand, if it is determined in step 1610 that (YES) the n-th electrode has a higher capacitance than the reference capacitor, then the rod is present underneath the n-th electrode and in step 1612 this becomes the electrode #2.

After the two electrodes (i.e., electrode #1 and electrode #2) are found, in step 1614 the RC bridge is connected to these electrodes and the bridge voltage $V_B$ is measured in the manner described above for the two-electrode system in FIG. 12. Finally, knowing the location of electrode #1 and electrode #2 the rod position z can be calculated in step 1616.

Figures 17A, 17B:
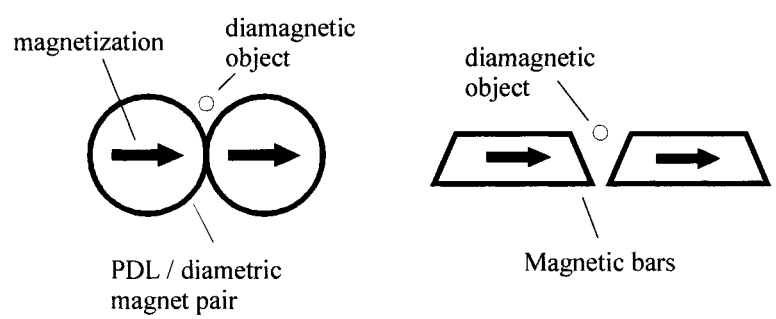
FIG. 17A is a diagram illustrating cylindrical diametric magnets according to an embodiment of the present invention.
FIG. 17B is a diagram illustrating bar magnets according to an embodiment of the present invention.

As provided above, the magnets of the present PDL traps can have an elongated shape such as a cylinder, bar, or stripe, whose magnetization is in the transverse direction (perpendicular to the long axis). An example of these magnets are shown (in cross-section) in FIGS. 17A and 17B depicting cylindrical diametric magnets and bar magnets, respectively. All of these magnets have magnetizations perpendicular to their long axes (e.g., in the examples depicted in FIGS. 17A and 17B, the long axis would be facing into and out of the page).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A parallel dipole line (PDL) trap comprising:
   a pair of dipole line magnets connected to a potential, wherein the pair of dipole line magnets comprises magnets having magnetizations perpendicular to long axes of the magnets;
   a diamagnetic rod levitating above the pair of dipole line magnets; and
   at least one electrode above the pair of dipole line magnets, adjacent to the diamagnetic rod.

2. The PDL trap of claim 1, wherein the electrode is present above the diamagnetic rod, and wherein the diamagnetic rod can pass between the electrode and the pair of dipole line magnets.

3. The PDL trap of claim 1, wherein the electrode is present both above and below the diamagnetic rod.

4. The PDL trap of claim 1, wherein the electrode is a cylinder.

5. The PDL trap of claim 1, wherein the diamagnetic rod comprises a graphite rod.

6. The PDL trap of claim 1, wherein the electrode is positioned off-center, to one side of the PDL trap.

7. The PDL trap of claim 1, further comprising:
   a voltage source connected to the electrode and to the pair of dipole line magnets.

8. The PDL trap of claim 1, further comprising:
   a capacitance meter connected to the electrode and to the pair of dipole line magnets.

9. The PDL trap of claim 1, comprising multiple electrodes positioned above the pair of dipole line magnets.

10. The PDL trap of claim 9, further comprising:
    a first electrode and a second electrode positioned above the pair of dipole line magnets, wherein the first electrode and the second electrode are positioned over opposite ends of the PDL trap.

11. The PDL trap of claim 10, further comprising:
    a first voltage source connected to the first electrode and to the pair of dipole line magnets; and
    a second voltage source connected to the second electrode and to the pair of dipole line magnets.

12. The PDL trap of claim 10, further comprising:
    resistors that form a double resistor-capacitor bridge with the first electrode and the second electrode.

13. The PDL trap of claim 9, wherein the electrode comprises at least one cylindrical case electrode having two semi-circular halves which are in a non-contact position relative to one another, and which partially surround the diamagnetic rod.

14. The PDL trap of claim 9, comprising more than two electrodes positioned above the pair of dipole line magnets.

15. The PDL trap of claim 14, further comprising:
    a multiplexer unit connected to the electrodes, wherein the multiplexer unit has two output channels connected to a double resistor-capacitor bridge.

16. A method of operating a PDL trap, comprising:
    providing the PDL trap having a pair of dipole line magnets comprising magnets having magnetizations perpendicular to long axes of the magnets, a diamagnetic rod levitating above the pair of dipole line magnets, and at least one electrode above the pair of dipole line magnets, adjacent to the diamagnetic rod; and
    applying a bias voltage to the pair of dipole line magnets and the electrode to change an electric potential of the PDL trap and control a position of the diamagnetic rod in the PDL trap.

17. The method of claim 16, further comprising:
    varying the bias voltage applied to the electrode to tune a one-dimensional potential along the PDL trap, wherein the one-dimensional potential comprises a magnetic camelback potential term and an electric potential term, and wherein the electric potential term is tunable by the bias voltage applied to the electrode and thus by way of the varying the bias voltage applied to the electrode the position of the diamagnetic rod in the PDL trap can be varied.

18. The method of claim 16, wherein the PDL trap has a first electrode and a second electrode positioned above the pair of dipole line magnets, wherein the first electrode and the second electrode are positioned over opposite ends of the PDL trap, the method further comprising:
    applying a first bias voltage to the pair of dipole line magnets and the first electrode to draw the diamagnetic rod towards the first electrode; and applying a second voltage to the pair of dipole line magnets and the second electrode to draw the diamagnetic rod towards the second electrode.

19. A method of operating a PDL trap, comprising:
providing the PDL trap having a pair of dipole line magnets comprising magnets having magnetizations perpendicular to long axes of the magnets, and at least one electrode above the pair of dipole line magnets;
connecting a capacitance meter to the electrode and to the pair of dipole line magnets;
measuring capacitance of the PDL trap using the capacitance meter to determine a base capacitance $C_0$;
inserting a diamagnetic rod into the PDL trap, such that the diamagnetic rod levitates above the pair of dipole line magnets;
measuring the capacitance of the PDL trap using the capacitance meter with the diamagnetic rod fully underneath the electrode: $\Delta C$;
measuring the capacitance of the PDL trap using the capacitance meter for any position z of the diamagnetic rod in the PDL trap: $C(z)$; and
determining the position z of the diamagnetic rod in the PDL trap using $C_0$, $\Delta C$ and $C(z)$.

20. The method of claim 19, wherein the PDL trap comprises multiple electrodes positioned above the pair of dipole line magnets, the method further comprising the step of:
connecting a resistor-capacitor (RC) bridge to the electrodes; and
measuring an output voltage from the RC bridge to determine the position z of the diamagnetic rod in the PDL trap, wherein the output voltage from the RC bridge is related to a differential change in capacitance of the electrodes under which the diamagnetic rod is located and thus the output voltage from the RC bridge depends on the position z of the diamagnetic rod in the PDL trap.

* * * * *